(12) United States Patent
Loechelt et al.

(10) Patent No.: US 8,647,970 B2
(45) Date of Patent: Feb. 11, 2014

(54) ELECTRONIC DEVICE COMPRISING CONDUCTIVE STRUCTURES AND AN INSULATING LAYER BETWEEN THE CONDUCTIVE STRUCTURES AND WITHIN A TRENCH

(75) Inventors: Gary H. Loechelt, Tempe, AZ (US); Prasad Venkatraman, Gilbert, AZ (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 0 days.

(21) Appl. No.: 13/327,390

(22) Filed: Dec. 15, 2011

(65) Prior Publication Data

US 2013/0153991 A1 Jun. 20, 2013

(51) Int. Cl.
*H01L 21/425* (2006.01)

(52) U.S. Cl.
USPC ............................. 438/525; 257/328

(58) Field of Classification Search
USPC ......... 257/330, 707, 676, 678, 687, 690, 692, 257/781, 782, 784, 786, 787; 438/106, 123, 438/124, 525
See application file for complete search history.

(56) References Cited

U.S. PATENT DOCUMENTS

| | | | |
|---|---|---|---|
| 5,569,949 A | 10/1996 | Malhi | |
| 5,667,632 A | 9/1997 | Burton et al. | |
| 6,084,268 A | 7/2000 | dr Frésart et al. | |
| 6,501,129 B2 | 12/2002 | Osawa | |
| 6,545,316 B1 | 4/2003 | Baliga | |
| 6,649,975 B2 | 11/2003 | Baliga | |
| 7,276,747 B2 | 10/2007 | Loechelt et al. | |
| 7,345,342 B2 | 3/2008 | Challa et al. | |
| 7,847,350 B2 | 12/2010 | Davies | |
| 7,868,379 B2 | 1/2011 | Loechelt | |
| 2006/0049455 A1 | 3/2006 | Jang et al. | |
| 2006/0214222 A1* | 9/2006 | Challa et al. | 257/328 |
| 2009/0096021 A1 | 4/2009 | Loechelt et al. | |
| 2010/0090269 A1 | 4/2010 | Davies | |
| 2010/0148245 A1 | 6/2010 | Loechelt | |
| 2010/0151646 A1 | 6/2010 | Loechelt | |
| 2011/0045664 A1 | 2/2011 | Davies | |
| 2011/0193143 A1 | 8/2011 | Loechelt et al. | |

OTHER PUBLICATIONS

Wolf, Stanley et al., "Silicon Processing for the VLSI Era," vol. 1: Process Technology, Copyright 1986 Lattice Press, 1986, 4 pgs.
Prasad Venkatraman et al., U.S. Appl. No. 13/327,361, filed Dec. 15, 2011.
Gary H. Loechelt, U.S. Appl. No. 13/327,422, filed Dec. 15, 2011.
Gary H. Loechelt et al., U.S. Appl. No. 13/327,454, filed Dec. 15, 2011.

* cited by examiner

*Primary Examiner* — Yu-Hsi D Sun
*Assistant Examiner* — Christina Sylvia
(74) *Attorney, Agent, or Firm* — Abel Law Group, LLP

(57) ABSTRACT

An electronic device can include a substrate including an underlying doped region and a semiconductor layer overlying the substrate. A trench can have a sidewall and extend at least partly through the semiconductor layer. The electronic device can further include a first conductive structure adjacent to the underlying doped region, an insulating layer, and a second conductive structure within the trench. The insulating layer can be disposed between the first and second conductive structures, and the first conductive structure can be disposed between the insulating layer and the underlying doped region. Processes of forming the electronic device may be performed such that the first conductive structure includes a conductive fill material or a doped region within the semiconductor layer. The first conductive structure can allow the underlying doped region to be farther from the channel region and allow $R_{DSON}$ to be lower for a given $BV_{DSS}$.

15 Claims, 9 Drawing Sheets

ELECTRONIC DEVICE COMPRISING CONDUCTIVE STRUCTURES AND AN INSULATING LAYER BETWEEN THE CONDUCTIVE STRUCTURES AND WITHIN A TRENCH

RELATED APPLICATION

This application is related to U.S. patent application Ser. No. 13/327,361 entitled "Electronic Device Comprising a Conductive Structure and an Insulating Layer Within a Trench and a Process of Forming the Same" by Ventkatraman et al. filed of even date, which is assigned to the current assignee hereof and incorporated herein by reference in its entirety.

FIELD OF THE DISCLOSURE

The present disclosure relates to electronic devices and processes of forming electronic devices, and more particularly to electronic devices including trenches and conductive structures therein and processes of forming the same.

RELATED ART

Metal-oxide semiconductor field effect transistors (MOSFETs) are a common type of power switching device. A MOSFET includes a source region, a drain region, a channel region extending between the source and drain regions, and a gate structure provided adjacent to the channel region. The gate structure includes a gate electrode layer disposed adjacent to and separated from the channel region by a thin dielectric layer.

When a MOSFET is in the on state, a voltage is applied to the gate structure to form a conduction channel region between the source and drain regions, which allows current to flow through the device. In the off state, any voltage applied to the gate structure is sufficiently low so that a conduction channel does not form, and thus current flow does not occur. During the off state, the device must support a high voltage between the source and drain regions.

In optimizing the performance of a MOSFET, a designer is often faced with trade-offs in device parameter performance. Specifically, available device structure or fabrication process choices may improve one device parameter, but at the same time such choices may degrade one or more other device parameters. For example, available structures and processes that improve on resistance ($R_{DSON}$) of a MOSFET may reduce the breakdown voltage ($DV_{DSS}$) and increase parasitic capacitance between regions within the MOSFET.

BRIEF DESCRIPTION OF THE DRAWINGS

Embodiments are illustrated by way of example and are not limited in the accompanying figures.

Figure 1:
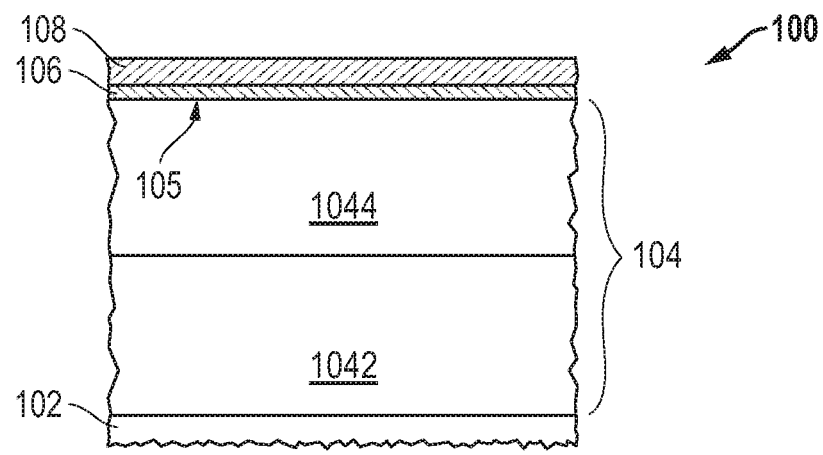
FIG. 1 includes an illustration of a cross-sectional view of a portion of a workpiece that includes an underlying doped region, a semiconductor layer, a pad layer, and a stopping layer.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other teachings can certainly be utilized in this application.

As used herein, the term "channel length" is intended to mean the distance between a source region and a drain region of a transistor that is measured substantially parallel to the current flow through a channel region during normal operation.

The terms "horizontally-oriented" and "vertically-oriented," with respect to a region or structure, refers to the principal direction in which current flows through such region or structure. More specifically, current can flow through a region or structure in a vertical direction, a horizontal direction, or a combination of vertical and horizontal directions. If current flows through a region or structure in a vertical direction or in a combination of directions, wherein the vertical component is greater than the horizontal component, such a region or structure will be referred to as vertically oriented. Similarly, if current flows through a region or structure in a horizontal direction or in a combination of directions, wherein the horizontal component is greater than the vertical component, such a region or structure will be referred to as horizontally oriented.

The term "normal operation" and "normal operating state" refer to conditions under which an electronic component or device is designed to operate. The conditions may be obtained from a data sheet or other information regarding voltages, currents, capacitance, resistance, or other electrical conditions. Thus, normal operation does not include operating an electrical component or device well beyond its design limits.

The terms "comprises," "comprising," "includes," "including," "has," "having" or any other variation thereof, are intended to cover a non-exclusive inclusion. For example, a method, article, or apparatus that comprises a list of features is not necessarily limited only to those features but may include other features not expressly listed or inherent to such method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read to include one or at least one and the singular also includes the plural, or vice versa, unless it is clear that it is meant otherwise. For example, when a single item is described herein, more than one item may be used in place of a single item. Similarly, where more than one item is described herein, a single item may be substituted for that more than one item.

Group numbers corresponding to columns within the Periodic Table of the elements use the "New Notation" convention as seen in the CRC Handbook of Chemistry and Physics, 81$^{st}$ Edition (2000-2001).

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the semiconductor and electronic arts.

An electronic device can include a transistor structure in which a conductive structure connects a part of a drain region to an underlying doped region that can be coupled to a drain terminal of the electronic device. The conductive structure can include a conductive fill material or may be a doped region within a semiconductor layer. In a particular embodiment, a heavily doped region, such as the underlying doped region may be moved further from a channel region of the transistor structure. Such a conductive structure can help to reduce $R_{DSON}$ without a significant decrease in $DV_{DSS}$. In an embodiment, many of the transistor structures can be connected in parallel and form a power transistor. Details regarding the structure and its formation are better understood with respect to particular embodiments as described below, where such embodiments are merely illustrative and do not limit the scope of the present invention.

FIG. 1 includes an illustration of a cross-sectional view of a portion of a workpiece 100. The workpiece 100 includes an underlying doped region 102 that is part of a substrate that may be lightly doped or heavily doped, n-type or p-type. For the purposes of this specification, heavily doped is intended to mean a peak dopant concentration of at least approximately $1 \times 10^{19}$ atoms/cm$^3$, and lightly doped is intended to mean a peak dopant concentration of less than $1 \times 10^{19}$ atoms/cm$^3$. The underlying doped region 102 can be a portion of a heavily doped substrate (e.g., a heavily n-type doped wafer) or may be a buried doped region overlying a base layer of opposite conductivity type or overlying a buried insulating layer (not illustrated) that lies between the base layer and the buried doped region. In a particular embodiment, the underlying doped region 102 can include a lightly doped portion overlying a heavily doped portion (for example, when an overlying semiconductor layer 104 has an opposite conductivity type) to help increase the junction breakdown voltage. In an embodiment, the underlying doped region 102 is heavily doped with an n-type dopant.

The semiconductor layer 104 overlies the underlying doped region 102 and has a primary surface 105 that is spaced apart from underlying doped region 102. The semiconductor layer 104 can include a Group 14 element (e.g., carbon, silicon, germanium, or any combination thereof) and any of the dopants as described with respect to the underlying doped region 102 or dopants of the opposite conductivity type. The semiconductor layer 104 may include a single layer or a plurality of layers. In the embodiment as illustrated in FIG. 1, the semiconductor layer 104 includes a semiconductor layer 1042 and a semiconductor layer 1044.

The semiconductor layer 1042 has a conductivity type that is the same as the underlying doped region 102. The semiconductor layer 1042 can have a dopant concentration of at least approximately $2 \times 10^{17}$ atoms/cm$^3$, and in another embodiment, a dopant concentration no greater than approximately $5 \times 10^{18}$ atoms/cm$^3$. The semiconductor layer 1044 is undoped or is relatively lighter doped as compared to the semiconductor layer 1042. When the semiconductor layer 1044 is doped, it may have the same type or different conductivity type as compared to the semiconductor layer 1042, and in an embodiment, has a dopant concentration of at least approximately $1 \times 10^{14}$ atoms/cm$^3$, and in another embodiment, has a dopant concentration of no greater than approximately $1 \times 10^{16}$ atoms/cm$^3$. The dopant concentration of the semiconductor layer 1044 at this point in the process flow may be referred to as the background dopant concentration. If the semiconductor layer 1044 is undoped, the background dopant concentration is approximately 0 atoms/cm$^3$.

In an embodiment, each of the semiconductor layers 1042 and 1044 has a thickness of least approximately 0.5 micron, approximately 1.1 microns, or at least approximately 1.5 microns, and in another embodiment, a thickness no greater than approximately 5 microns, no greater than approximately 4 microns, or no greater than approximately 3 microns. In an embodiment, a ratio of the thickness of the semiconductor layer 1042 to the thickness of the semiconductor layer 1044 is at least approximately 1:1.1, at least approximately 1:1.5, or at least approximately 1:3, and in another embodiment, the ratio is no greater than approximately 3:1, no greater than approximately 1.5:1, or no greater than approximately 1.1:1.

Figure 2:
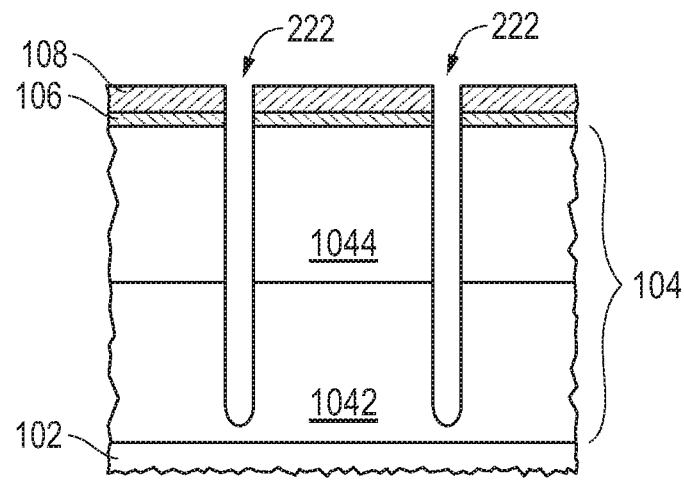
FIG. 2 includes an illustration of a cross-sectional view of the workpiece of FIG. 1 after forming a trench extending through a semiconductor layer to the underlying doped region.

A pad layer 106 and a stopping layer 108 (e.g., a polish-stop layer or an etch-stop layer) are formed over the semiconductor layer 104 using a thermal growth technique, a deposition technique, or a combination thereof. Each of the pad layer 106 and the stopping layer 108 can include an oxide, a nitride, an oxynitride, or any combination thereof. In an embodiment, the pad layer 106 has a different composition as compared to the stopping layer 108. In a particular embodiment, the pad layer 106 includes an oxide, and the stopping layer 108 includes a nitride. The pad layer 106 is relatively thin, and the stopping layer 108 is relatively thick. The pad layer 106 can have a thickness in a range of approximately 2 to approximately 100 nm. In an embodiment, the stopping layer 108 has a thickness in a range of approximately 50 nm to approximately 300 nm. As illustrated in FIG. 2, the stopping layer 108 is patterned.

FIG. 2 includes an illustration of a cross-sectional view after patterning the pad and stopping layers 106 and 108 and forming a trench 222. A patterned resist layer (not illustrated) is formed over the stopping layer 108. A portion of the stopping layer 108 underlying an opening in the patterned resist layer is etched to define an opening within the stopping layer 108. In an embodiment, the width of the opening in the stopping layer 108 can be at least approximately 0.1 micron or at least approximately 0.2 micron, and in another embodiment, the width of the opening in the stopping layer 108 may be no greater than approximately 0.95 micron or no greater than approximately 0.7 micron. In an embodiment, the pad layer 106 may not be significantly etched during the patterning of the stopping layer 108. In another embodiment, portions of the pad layer 106 below the openings in the stopping layer 108 may be removed at this time. The patterned resist layer can then be removed.

The stopping layer 108 can act as a hard mask during the trench etch. If openings through the pad layer 106 have not been etched, they are etched before etching the semiconductor layer 104. The semiconductor layer 104 can be etched to define the trench 222. In an embodiment, the trench 222 extends through at least approximately 50%, at least approximately 70%, at least approximately 90%, or substantially all of the thickness of the semiconductor layer 104 to the underlying doped region 102. In an alternate embodiment that will be described later, the trenches may extend no greater than approximately 50% of the thickness of the semiconductor layer 104. Other than rounding near the bottom of the trench 222, the trench 222 may have a substantially uniform width. The bottom of the trench 222 can have a substantially rounded bottom (that is, substantially U-shaped), illustrated in FIG. 2, or may have a relatively flat bottom and rounded corners, not illustrated. The width of the trench 222 can be wide enough such that a subsequently-formed insulating layer does not completely fill the opening and not so wide that a combination of subsequently-formed insulating and conductive layers do not completely fill the trench 222. In an embodiment, the width of the trench 222 can be substantially the same as the width as the opening in the stopping layer 108.

Figure 3:
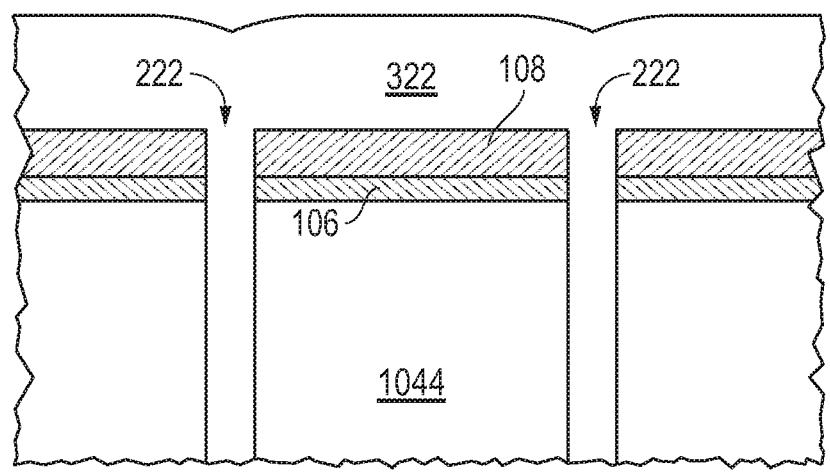
FIG. 3 includes an illustration of a cross-sectional view of the workpiece of FIG. 2 after forming a conductive layer that substantially fills the trench.

A conductive layer 322 is formed over the stopping layer 108 and within the trench 222, as illustrated in FIG. 3. The conductive layer 322 substantially fills the trench 222. The conductive layer 322 can include a metal-containing or semiconductor-containing material. In an embodiment, the conductive layer 322 can include a heavily doped semiconductor material, such as amorphous silicon or polysilicon. In another embodiment, the conductive layer 322 includes a plurality of films, such as an adhesion film, a barrier film, and a conductive fill material. In a particular embodiment, the adhesion film can include a refractory metal, such as titanium, tantalum, or the like; the barrier film can include a refractory metal nitride, such as titanium nitride, tantalum nitride, or the like, a refractory silicide, such as tungsten silicide, titanium silicide, or the like, or a refractory metal-semiconductor-nitride, such as TaSiN; and the conductive fill material can include tungsten. In a more particular embodiment, the conductive layer 322 can include Ti/TiN/W. The selection of the number of films and composition(s) of those film(s) depend on electrical performance, the temperature of a subsequent heat cycle, another criterion, or any combination thereof. Refractory metals and refractory metal-containing compounds can withstand high temperatures (e.g., melting points of such materials can be at least 1400° C.), may be conformally deposited, and have a lower bulk resistivity than heavily doped n-type silicon. After reading this specification, skilled artisans will be able to determine the composition of the conductive layer 322 to meet their needs or desires for a particular application.

Figure 4:
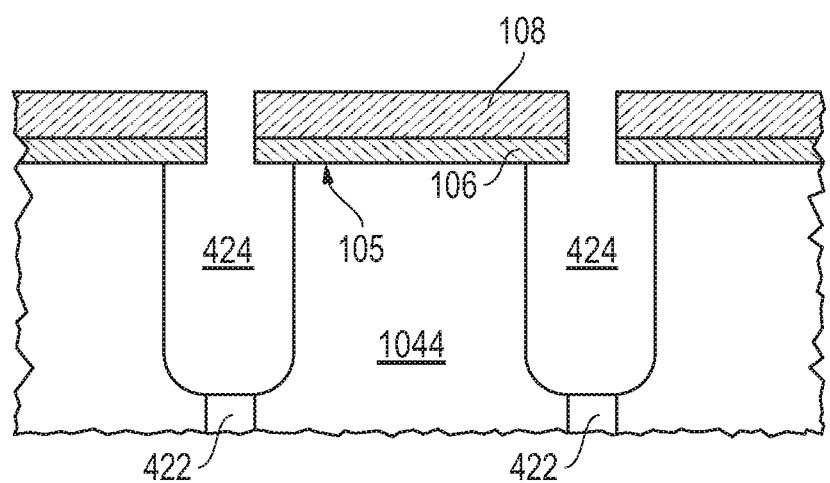
FIG. 4 includes an illustration of a cross-sectional view of the workpiece of FIG. 3 after removing a portion of the conductive layer lying outside the trench, and after widening the trench.

A portion of the conductive layer 322 that overlies the stopping layer 108 is removed. The removal can be performed using a chemical-mechanical polishing or blanket etching technique. The stopping layer 108 may be used as a polish-stop or etch-stop layer. Etching may be used or continued after the stopping layer 108 is exposed to recess the conductive structure 422, such that the tops of the conductive structure 422 are disposed below the primary surface 105, as illustrated in FIG. 4. The recess etch can be performed as an anisotropic etch. In a particular embodiment, an isotropic etch may be performed to form widened trench 424. In an embodiment, the conductive structure 422 may recessed to a depth at least approximately 0.5 micron or at least approximately 0.9 micron below the primary surface 105. The maximum normal operating voltage may affect an upper limit for the depth. In a non-limiting example, when the maximum operating voltage is approximately 30 V, the depth may be no greater than approximately 3 microns below the primary surface 105, and when the maximum operating voltage is approximately 100 V, the depth may be no greater than approximately 5 microns below the primary surface 105. In an embodiment, the widened trench 424 can be at least approximately 0.05 micron or at least approximately 0.11 micron wider than the trench 222 previously formed, and in another embodiment, the widened trench 424 may be no greater than approximately 0.4 micron or no greater than approximately 0.3 micron wider than the trench 222 previously formed.

Figure 5:
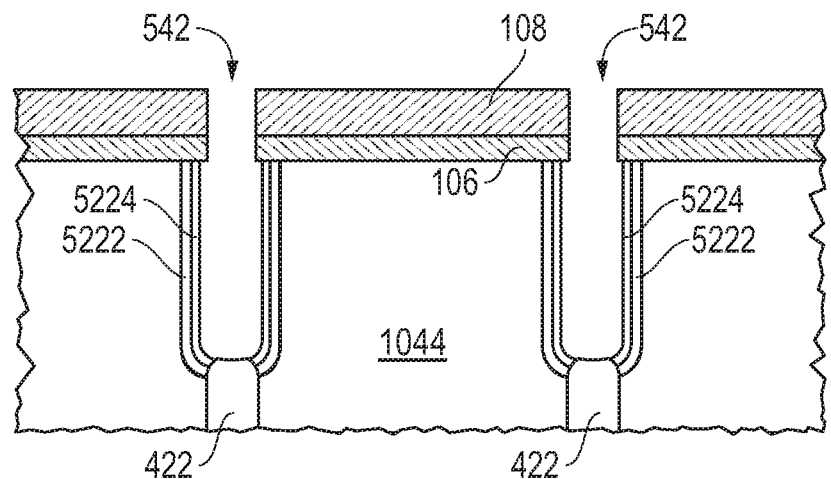
FIG. 5 includes an illustration of a cross-sectional view of the workpiece of FIG. 4 after forming a semiconductor layer within the widened trench.

A doped semiconductor layer can be formed within the widened trench 424. The doped semiconductor layer can include any of the materials as previously described with respect to semiconductor layer 104. In an embodiment as illustrated in FIG. 5, a selective epitaxial deposition can be performed to form portions 5222 and 5224 of a semiconductor layer. The portion 5222 includes a dopant that has a same conductivity type as the underlying doped region 102 (as illustrated in FIGS. 1 and 2). In a particular embodiment, the portion 5222 has a dopant concentration of at least approximately $5 \times 10^{16}$ atoms/cm$^3$, at least approximately $1 \times 10^{17}$ atoms/cm$^3$, or at least approximately $3 \times 10^{17}$ atoms/cm$^3$, and in another embodiment, the dopant concentration is no greater than approximately $5 \times 10^{18}$ atoms/cm$^3$, no greater than approximately $2 \times 10^{18}$ atoms/cm$^3$, or no greater than approximately $9 \times 10^{17}$ atoms/cm$^3$. The portion 5224 is undoped or has a dopant concentration no greater than approximately $1 \times 10^{16}$ atoms/cm$^3$. In an embodiment, each of the portions 5222 and 5224 has a thickness of at least approximately 30 nm, at least approximately 50 nm, or at least approximately 70 nm, and each of the portions 5222 and 5224 has a thickness no greater than approximately 300 nm, no greater than approximately 200 nm, or no greater than approximately 150 nm. The thicknesses may be substantially the same or different as compared to each other. After forming the doped semiconductor layer, the trench 542 is narrower than the trenches 424. The trench 542 may have substantially the same width or different widths as compared to the trench 222.

Figure 6:
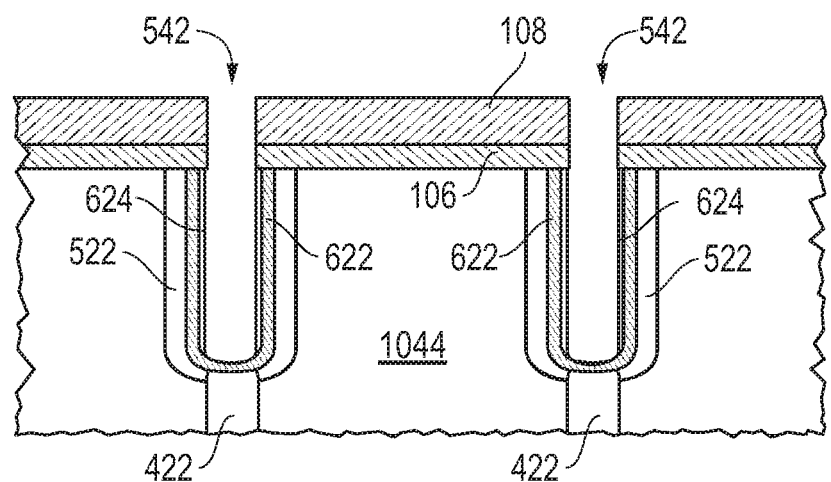
FIG. 6 includes an illustration of a cross-sectional view of a portion of the workpiece of FIG. 5 after forming insulating spacers within the trench.

In FIG. 6, a pad layer 622 and an oxidation-resistant layer 624 are formed within the trench 542. The combination of the portions 5222 and 5224 is illustrated as vertically-oriented doped regions 522 in FIG. 6, which can be part of the drift regions for the transistor structure being formed. The vertically-oriented doped regions 522 can have a peak dopant concentration in a range of approximately $2 \times 10^{17}$ atoms/cm$^3$ to approximately $5 \times 10^{18}$ atoms/cm$^3$. The pad layer 622 can have any of the compositions or thicknesses, or be formed using any of the techniques as previously described with respect to the pad layer 106. The oxidation-resistant layer 624 can have any of the compositions or be formed using any of the techniques as previously described with respect to the stopping layer 108. The oxidation-resistant layer 624 can have a thickness in a range of approximately 20 nm to approximately 90 nm. The pad layer 622 and oxidation-resistant layer 624 are anisotropically etched to form spacer structures within the trench 542.

Figure 7:
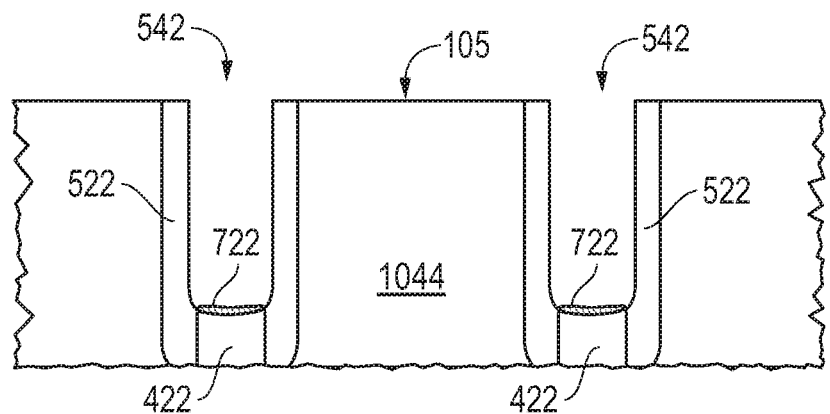
FIG. 7 includes an illustration of a cross-sectional view of the workpiece of FIG. 6 after forming an insulating layer along the bottom of the trench and after removing the pad and stopping layers.

In FIG. 7, a thermal oxidation is performed to form an oxide 722 along the bottom of the trench 542. In an embodiment, the oxide 722 can have an initially grown thickness of at least approximately 150 nm, at least approximately 250 nm, or at least approximately 350 nm, and in another embodiment, the oxide 722 may have an initially grown thickness no greater than approximately 800 nm, no greater than approximately 650 nm, or no greater than approximately 500 nm. When the oxide 722 is performed as a thermal oxidation, some corner rounding may occur with the semiconductor layer 1044 adjacent to the primary surface. The stopping layer 108 and the oxidation-resistant layer 624 are removed. When both the stopping layer 108 and the oxidation-resistant layer 624 include nitride, the removal may be performed as a wet chemical nitride strip. In an alternative embodiment, the removal may be performed as an isotropic dry etch. The pad layers 106 and 622 are then removed. When both pad layers 106 and 622 include oxide, the removal may be performed as a wet chemical oxide strip. In an alternative embodiment, the removal may be performed as an isotropic dry etch. Only some of the oxide 722 will be removed and have a remaining thickness of at least approximately 50 nm, at least approximately 150 nm, or at least approximately 250 nm, and in another embodiment, the oxide 722 can have a remaining thickness no greater than approximately 700 nm, no greater than approximately 550 nm, or no greater than approximately 400 nm.

Figure 8:
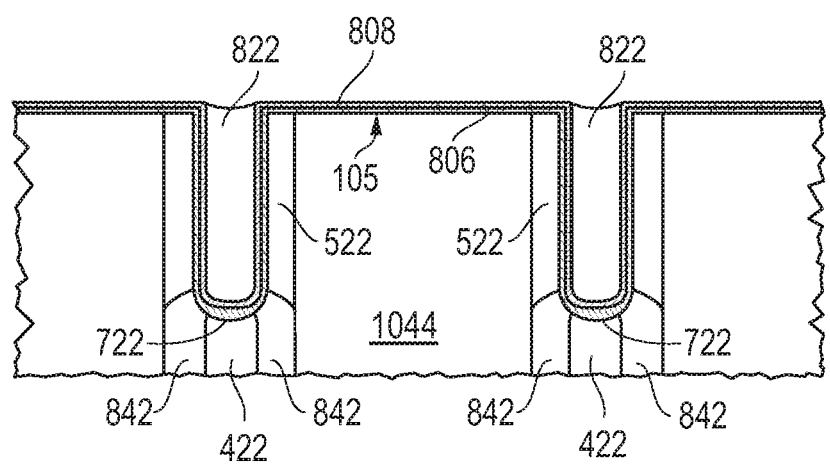
FIG. 8 includes an illustration of a cross-sectional view of the workpiece of FIG. 7 after forming another pad layer and another stopping layer.

In FIG. 8, a pad layer 806, a stopping layer 808, and a conductive structure 822 are formed. Each of the pad layer 806 and the stopping layer 808 can include an oxide, a nitride, an oxynitride, or any combination thereof. In an embodiment, the pad layer 806 and the stopping layer 808 have different compositions. In a particular embodiment, the pad layer 806 can include an oxide, and the stopping layer 808 can include a nitride. In another embodiment, the pad layer 806 can have a thickness of at least approximately 11 nm or at least approximately 20 nm, and in still another embodiment, the pad layer 806 may have a thickness no greater than approximately 60 nm or no greater than approximately 40 nm. The pad layer 806 can be formed by a thermally growth or deposition technique. When the pad layer 806 is thermally grown, the oxide layer 722 may become slightly thicker. The oxide layer 722 can still have a thickness in the ranges as previously described. In a further embodiment, the stopping layer 808 can have a thickness of at least approximately 20 nm or at least approximately 30 nm, and in still another embodiment, the stopping layer 808 may have a thickness no greater than approximately 150 nm or no greater than approximately 90 nm. The stopping layer 808 can be formed using a deposition technique.

The conductive structure 822 can include any of the materials and be formed using any of the techniques as described with respect to the conductive structure 422, except the conductive structure 822 is not recessed or substantially less recessed within the trench as compared to the conductive structure 422. FIG. 8 further includes heavily doped regions 842 that can be formed when the conductive structure 422 includes a doped semiconductor material. Although not previously illustrated, such regions are formed when dopant is diffused during thermal processing used in forming the layers formed after the conductive structure 422 has been formed. Thus, the heavily doped regions 842 are initially formed earlier in the process but are not illustrated to simplify understanding the concepts described herein. The drain region of the transistor structure being formed includes the doped regions 522, the heavily doped regions 842, and underlying doped region 102 (not illustrated in FIG. 8).

Figure 9:
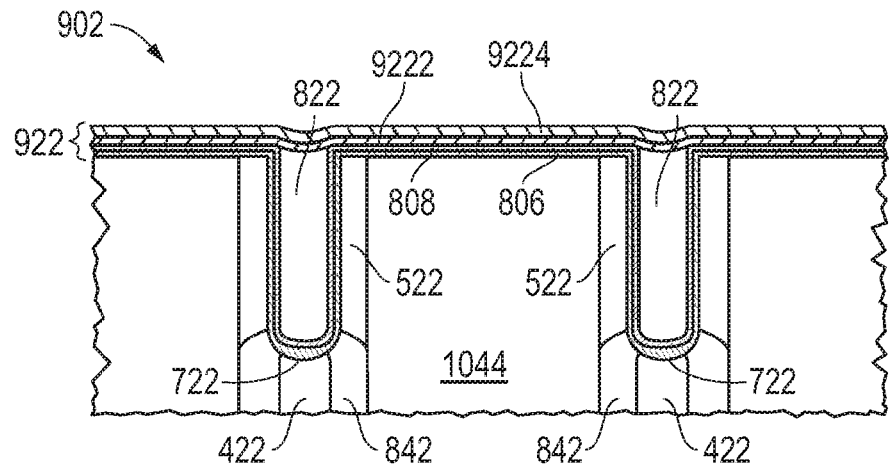
FIG. 9 includes an illustration of a cross-sectional view of the workpiece of FIG. 8 after forming a conductive layer.

FIG. 9 illustrates a conductive electrode 902 that includes the conductive structure 822 and a conductive layer 922. The conductive electrode 902 can help to reduce capacitive coupling between the drain region and the subsequently-formed gate electrode. The conductive layer 922 can include any of the materials as previously described with respect to the conductive structure 422. In an embodiment, the conductive layer 922 can have a thickness of at least approximately 50 nm, at least 110 nm, or at least 150 nm, and in another embodiment, the conductive layer 922 may have a thickness no greater than approximately 500 nm, no greater than approximately 300 nm, or no greater than approximately 200 nm. In a particular embodiment, the conductive layer 922 can include a doped semiconductor film 9222 and a refractory metal-semiconductor film 9224. In another embodiment, the conductive layer 922 can include a single film, more films, or different compositions of films. The oxide 722 is significantly thicker than the pad layer 806 and helps to reduce capacitive coupling between the conductive electrode 902 and the conductive structure 422, if the oxide 722 were to be replaced by the pad layer 806.

Figure 10:
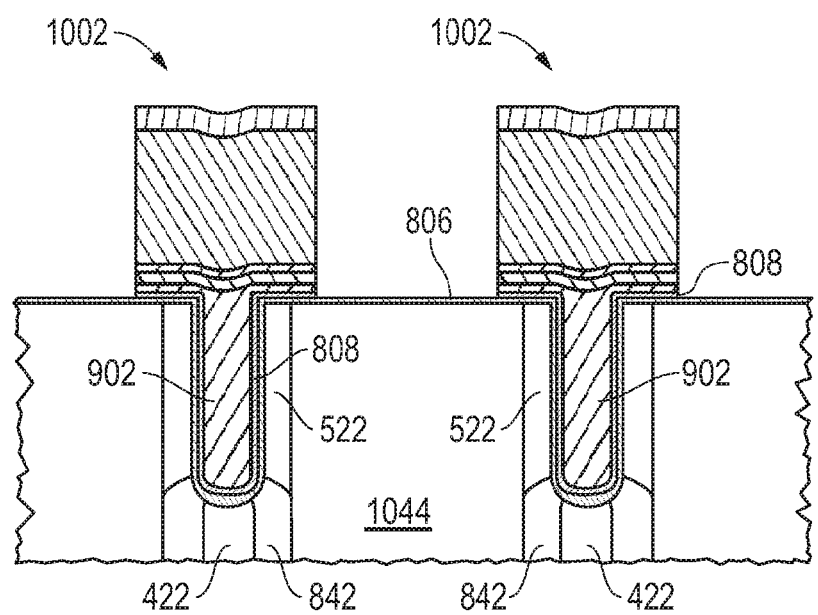
FIG. 10 includes an illustration of a cross-sectional view of the workpiece of FIG. 9 after forming insulating members.

FIG. 10 illustrates insulating members 1002 formed over the trenches and doped regions 522. An insulating layer can be deposited over the conductive electrode 902 and etched to form the insulating members 1002. The insulating layer can include an oxide, a nitride, an oxynitride, or any combination thereof. The insulating layer can include a single film or a plurality of films. In a particular embodiment, the insulating layer can include an etch-stop film adjacent to conductive electrode 902, a main oxide film that comprises at least 50% of the total thickness of the insulating film, and an antireflective film farthest from the conductive electrode 902 as compared to the etch-stop and main oxide films. The insulating layer can have a thickness in a range of approximately 0.3 micron to approximately 2.0 microns. The insulating layer is patterned to form the insulating members 1002. Portions of the conductive electrode 902 and stopping layer 808 are also patterned.

Figure 11:
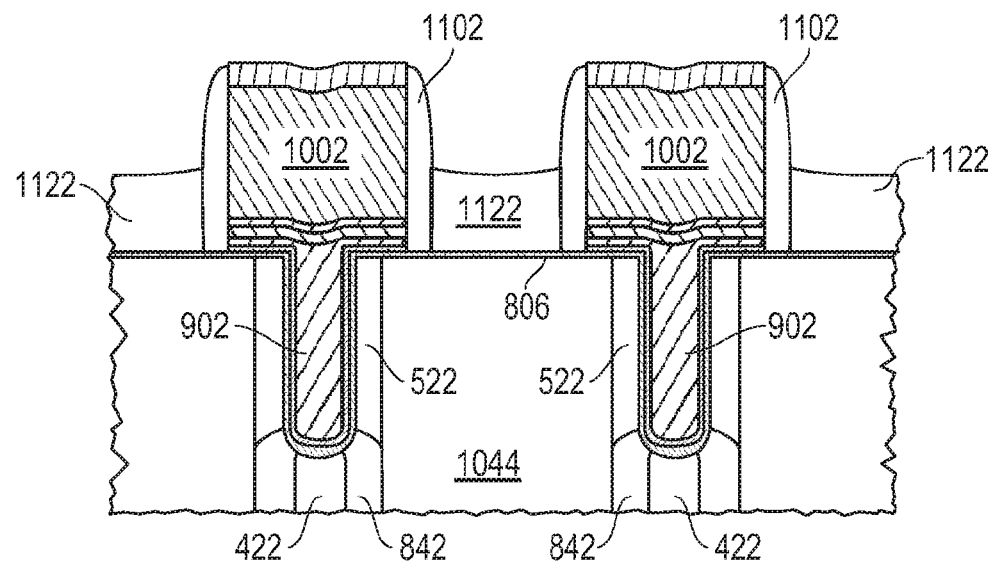
FIG. 11 includes an illustration of a cross-sectional view of the workpiece of FIG. 10 after forming sacrificial spacers and sacrificial members.

FIG. 11 illustrates sacrificial spacers 1102 and sacrificial members 1122 formed within the openings between the insulating members 1002. The widths of the sacrificial spacers 1102 correspond to the width of doped regions that will be formed at least partly within the semiconductor layer 1044 adjacent to the doped regions 522. The widths of the sacrificial spacers 1102, as measured at the base of the sacrificial spacers 1102 (hereinafter referred to as the "spacer widths"), may be at least approximately 0.05 micron, and in still another embodiment, the spacer widths may be no greater than approximately 0.3 micron.

The sacrificial members 1122 are disposed at portions of the openings between the sacrificial spacers 1102. The sacrificial members 1122 have a thickness sufficient to substantially prevent doping of underlying regions, when the doping is performed after removing the sacrificial spacers 1102. In an embodiment, the sacrificial members 1122 have a thickness of at least approximately 100 nm. In another embodiment, the sacrificial members 1122 may fill approximately 10 to 70 percent of the depth of the openings between the insulating members 1002. The sacrificial members 1122 do not cover all of the top of the sacrificial spacers 1102, as the sacrificial spacers 1102 are selectively removed.

The sacrificial spacers 1102 have a different material as compared to an exposed material of the insulating members 1002 and the sacrificial members 1122. The sacrificial members 1122 have a different material as compared to the insulating members 1002. In a particular embodiment, the exposed material of the insulating members 1002 include a nitride, the sacrificial spacers 1102 include amorphous or polycrystalline silicon, and the sacrificial members 1122 include an organic resist material. The sacrificial spacers 1102 are formed by depositing a layer including amorphous or polycrystalline silicon to a thickness corresponding to the spacer widths, as previously discussed, and anisotropically etching the layer. The sacrificial members 1122 can be formed by coating the organic resist material over the workpiece and within the openings between the sacrificial spacers 1102. The organic resist material can be etched back to leave the sacrificial members 1122. In a particular embodiment, the organic resist material can be etched using endpoint detection set on detection of the exposed material of the insulating members 1002 or sacrificial spacers 1102. A timed etch can then be used to achieve the desired thickness of the sacrificial members 1122. If needed or desired, the sacrificial members 1122 may be reflowed. The reflow may be performed to reduce the likelihood of implant shadowing from portions of the sacrificial members 1122 that were disposed adjacent to portions of the sacrificial spacers 1102.

Figure 12:
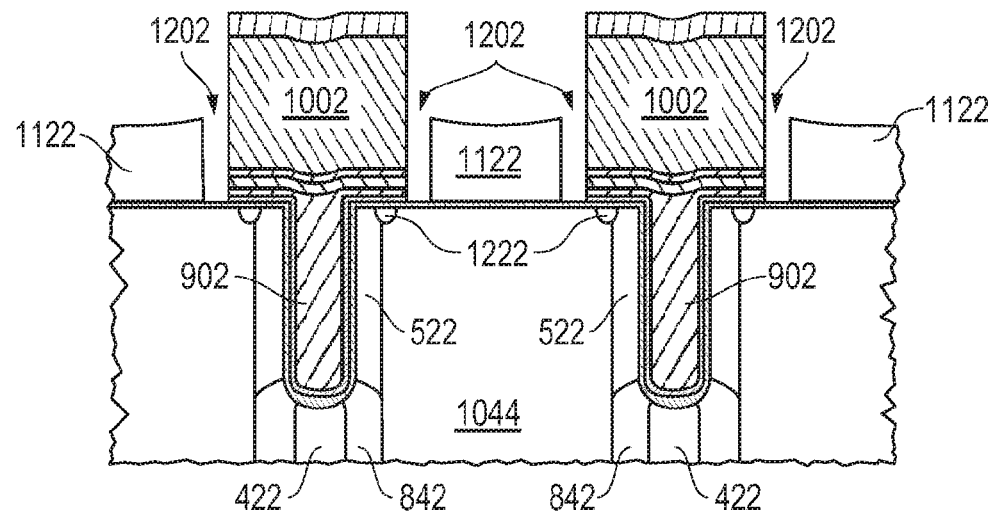
FIG. 12 includes an illustration of a cross-sectional view of the workpiece of FIG. 11 after removing the sacrificial spacers and doping a portion of the semiconductor layer.

FIG. 12 includes an illustration of the workpiece after forming doped regions 1222. The doping can be performed as an implantation. In an embodiment, ions (illustrated by arrows 1202) are directed to the exposed surface of the workpiece at a substantially 0° tilt angle implant (that is, substantially perpendicular to the primary surface of the semiconductor layer 1044). In another embodiment, another angle may be used, and the workpiece may be rotated during or between portions of the implant to reduce the effects of shadowing caused by features overlying the semiconductor layer 1044. If channeling is a concern, the implant may be performed with an approximately 7° tilt angle. The implantation can be performed during 4 portions, wherein the workpiece is rotated approximately 90° between each of the portions.

In an embodiment, the peak dopant concentration of the doped regions 1222 is may be in a range of approximately $4\times10^{16}$ atoms/cm$^3$ to approximately $2\times10^{18}$ atoms/cm$^3$. The depths of the doped regions 1222 may not have specific limits. In an embodiment, the depths of the doped regions 1222 may be approximately 0.02 micron to approximately 0.30 micron. The widths of the doped regions 1222 can be any of the width dimensions as previously described with respect to the spacer widths of the sacrificial spacers 1102. After the doped regions 1222 are formed, the sacrificial members 1122 can be removed.

Figure 13:
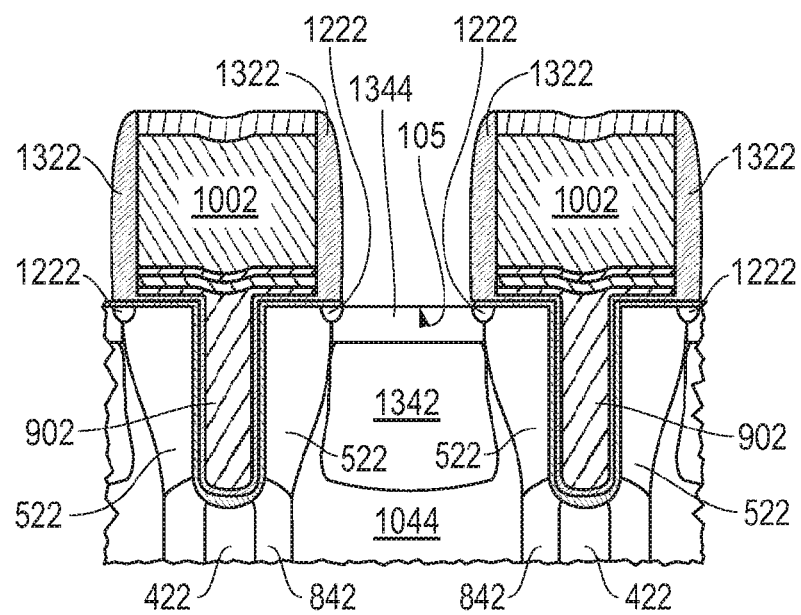
FIG. 13 includes an illustration of a cross-sectional view of the workpiece of FIG. 12 after removing the sacrificial members and forming deep body and channel doped regions.

FIG. 13 includes an illustration after forming another set of insulating spacers 1322, a deep body region 1342, and a channel doped region 1344. The insulating spacers 1322 are adjacent to the insulating members 1002 and cover the doped regions 1222 so that the doped regions 1222 will not be counter doped when the channel doped region 1344 is formed. Thus, the insulating spacers 1322 can have any of the width dimensions as previously described with respect to the spacer widths of the sacrificial spacers 1102. In a particular embodiment, the insulating spacers 1332 can include substantially the same material as the exposed surface of the insulating members 1002.

The deep body doped region 1342 and the channel doped region 1344 have a same conductivity type. The deep body doped region 1342 can have a peak dopant concentration in a range of approximately $8\times10^{15}$ atoms/cm$^3$ to approximately $2\times10^{17}$ atoms/cm$^3$, and the channel doped region 1344 can have a peak dopant concentration in a range of approximately $6\times10^{16}$ atoms/cm$^3$ to approximately $4\times10^{18}$ atoms/cm$^3$. In an embodiment, the channel doped region 1344 can have a peak dopant concentration at a depth of at least approximately 0.05 micron or at least approximately 0.1 micron, and in another embodiment, a peak dopant concentration may be at a depth no greater than approximately 0.4 micron, or no greater than approximately 0.3 micron. In an embodiment, the peak dopant concentration of the deep body doped region 1342 is at least approximately 0.1 micron deeper than the peak dopant concentration of the channel doped region 1344, and in another embodiment, the peak dopant concentration of the deep body doped region 1342 is no greater than approximately 0.9 micron deeper than the peak dopant concentration of the channel doped region 1344. In a further embodiment, the peak dopant concentration of the deep body doped region 1342 is in a range of approximately 0.6 micron to approximately 1.1 microns below the primary surface 105.

Figure 14:
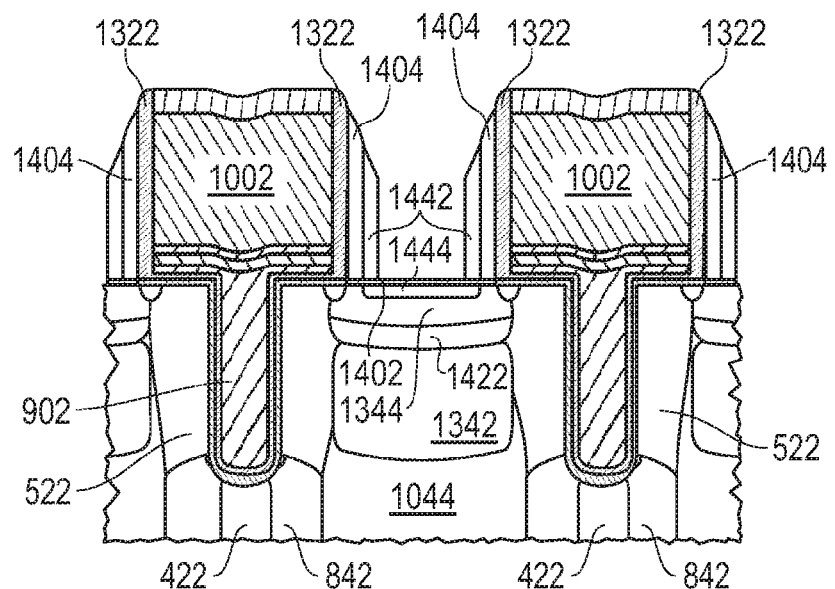
FIG. 14 includes an illustration of a cross-sectional view of the workpiece of FIG. 13 after forming gate electrodes, body regions, a sidewall spacer, and a source region.

FIG. 14 includes an illustration of the workpiece at a later time during processing. Exposed portions of the pad layer 806 are removed and a gate dielectric layer 1402 is formed over the channel doped region 1344, and gate members 1404 are formed. In an embodiment, the gate members 1404 are formed as sidewall spacers and include gate electrodes for the transistor structure being formed. A body doped region 1422 is formed and can have a peak dopant concentration in a range of approximately $2\times10^{17}$ atoms/cm$^3$ to approximately $8\times10^{18}$ atoms/cm$^3$. The peak dopant concentration of the body doped region 1422 is at a depth between the depths of the peak dopant concentrations of the deep body region 1342 and the channel doped region 1344. In an embodiment, the peak dopant concentration is in a range of approximately 0.2 micron to approximately 0.9 micron.

Sidewall spacers 1442 and a source region 1444 are formed as illustrated in the embodiment of the FIG. 14. The source region 1444 may include a relatively lighter doped portion and a relatively heavier doped portion. In a particular embodiment, the body doped region 1422 and the relatively lighter doped portion of the source region 1444 are formed before the sidewall spacers 1442 are formed, and the relatively heavier doped portion of the source region 1444 is formed after forming the sidewall spacer 1442. The sidewall spacers 1442 can include an insulating material, and in an embodiment, include an oxide. The sidewall spacers 1442 have widths at their bases in a range approximately 50 nm to approximately 250 nm. The relatively lighter portion of the source region 1444 can have a peak dopant concentration in a range of approximately $1\times10^{17}$ atoms/cm$^3$ to approximately $5\times10^{18}$ atoms/cm$^3$, and the relatively heavier portion of the source region 1444 can have can have a peak dopant concentration of at least approximately $1 \times 10^{19}$ atoms/cm$^3$. The source region 1444 has a depth in a range of approximately 0.05 nm to approximately 0.4 nm.

Figure 15:
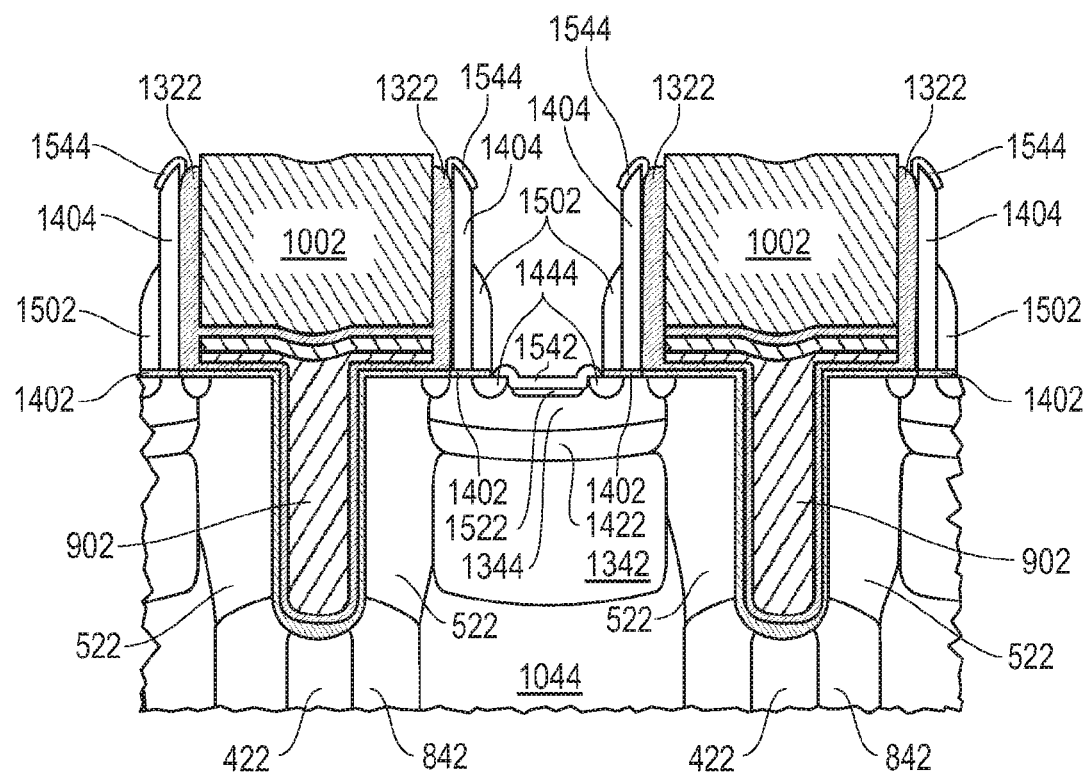
FIG. 15 includes an illustration of a cross-sectional view of the workpiece of FIG. 14 after forming sidewall spacers, etching through part of the source region, forming a body contact region, and forming silicide members.

FIG. 15 includes an illustration of the workpiece after further processing. In a particular embodiment, a layer having substantially the same composition as the sidewall spacers 1442 is deposited and etched to form a widened sidewall spacer (not illustrated). The portion of the source region 1444 is etched to produce an annular source region 1444 and expose the channel doped region 1344. A body contact region 1522 is then formed from a portion of the channel doped region 1344. The body contact region 1522 has a peak doping concentration at least approximately $1 \times 10^{19}$ atoms/cm$^3$. A portion of the widened sidewall spacer is etched to form the sidewall spacer 1502 so that portions of the source region 1444 and the body contact region 1522 are exposed between portions of the sidewall spacer 1502. Portions of the sidewall spacers 1322 may be etched to expose more of the gate members 1404. A refractory silicide member 1542 is formed from exposed portions of the source region 1344 and body contact region 1522, and refractory silicide members 1544 are formed from exposed portions of the gate members 1404. The refractory silicide member 1542 electrically shorts the source region 1444 to the body contact region 1522.

Figure 16:
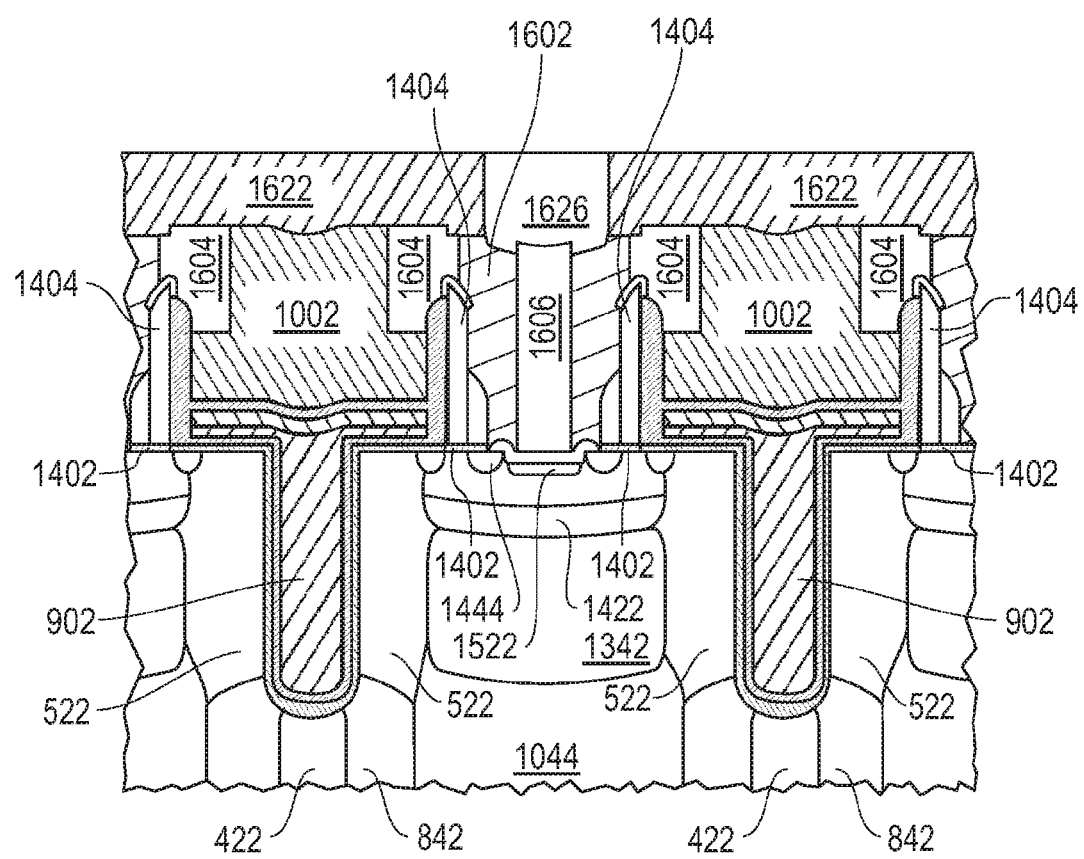
FIG. 16 includes an illustration of a cross-sectional view of the workpiece of FIG. 15 after forming a substantially completed electronic device.

FIG. 16 includes an illustration of a substantially completed electronic device. An interlevel dielectric (ILD) layer 1602 is formed and can include a single film or a plurality of discrete films. The ILD layer 1602 may be planarized to improve process margin during subsequent processing operations (for example, lithography, subsequent polishing, or the like). The ILD layer 1602 is patterned to define contact openings, and conductive plugs 1604 and 1606 are formed within the contact openings. The conductive plugs 1604 are electrically connected to the gate members 1404, and the conductive plugs 1606 are electrically connected to the source region 1444 and the body contact region 1522. The conductive plugs 1604 and 1606 may be formed during the same or different processing sequences. Many other conductive plugs are formed, and such other conductive plugs would be visible in other views.

Another interlevel dielectric (ILD) layer 1622 is formed and can include a single film or a plurality of discrete films. The ILD layer 1622 may be planarized to improve process margin during subsequent processing operations (for example, lithography, subsequent polishing, or the like). The ILD layer 1622 is patterned to define interconnect trenches, and interconnect members 1626 are formed within the interconnect trenches. The interconnect members 1626 are electrically connected to the source region 1444 and the body contact region 1522. Many other conductive interconnect members are formed, and such other conductive plugs would be visible in other views Although not illustrated, additional or fewer layers or features may be used as needed or desired to form the electronic device. Field isolation regions are not illustrated but may be used to help electrically isolate portions of the high-side power transistors from the low-side power transistors. In another embodiment, more insulating and interconnect levels may be used. A passivation layer can be formed over the workpiece or within the interconnect levels. After reading this specification, skilled artisans will be able to determine layers and features for their particular application. Throughout the process, anneals and other heat cycles are not described but will be used to active dopants, drive dopant, densify a layer, achieve another desired result, or any combination thereof. After reading this specification, skilled artisans will be able to determine a particular process flow for a particular application or to achieve a desired electronic device consistent with the teachings herein.

The electronic device can include many other transistor structures that are substantially identical to the transistor structures as illustrated in FIG. 16. The transistor structures in FIG. 16 can be connected in parallel to each other to form a power transistor. Such a configuration can give a sufficient effective channel width of the electronic device that can support the relatively high current flow that is used during normal operation of the electronic device. In a particular embodiment, each power transistor may be designed to have a maximum source-to-drain voltage difference of approximately 30 V, and a maximum source-to-gate voltage difference of approximately 20 V. During normal operation, the source-to-drain voltage difference is no greater than approximately 20 V, and the source-to-gate voltage difference is no greater than approximately 9 V.

In an alternative embodiment, the conductive structure 422 can be in the form of a doped region with the semiconductor layer 104. Referring to FIG. 2, the semiconductor layer 1042 can be formed and selectively doped where the trench 222 would otherwise be formed. The peak doping concentration for the selectively doped regions can be at least approximately $1 \times 10^{19}$ atoms/cm$^3$. A single implant or a series of implants may be performed to achieve a doped region having a shape that is substantially similar to the conductive structure 422. The semiconductor layer 1044 can then be formed, and trenches can then be formed similar to the trench 424 in FIG. 4. Alternatively, the semiconductor layers 1042 and 1044 can formed; however, the depth of the trench 222 is substantially shallower and corresponds to portions of the conductive electrode 902 and associated insulating layers that will be formed within the trench 222. The bottom of the trench is implanted with dopant using a single or a series of implants to achieve a doped region substantially similar to the doped region described with respect to the doped region formed in the semiconductor layer 1042 before forming the semiconductor layer 1044. Thus, the doped region can be formed substantially aligned to the trench 222. For either or both alternative embodiments, processing can be continued as previously described. Thus, when the conductive structure 422 includes a conductive fill material or a doped region, such conductive structure 422 generally corresponds to the trench 222.

In another alternatively embodiment, after forming the conductive structures 422 within the trench 222, the trench 222 may not be widened. Instead of depositing semiconductor layer(s) of which at least one includes a dopant to form the doped regions 522, the portions of the semiconductor layer 1044 adjacent to the sidewall of the trench 222 may be doped using furnace doping or ion implantation. The dopant concentration for such doped regions is substantially similar to those previously disclosed with respect to the doped regions 522. Processing can be continued as previously described.

The electronic device can be used in an application where the switching speed of the power transistor needs to be relatively high. The conductive structure 422 can allow better conduction within the drain region, particularly to the underlying doped region 102.

Many different aspects and embodiments are possible. Some of those aspects and embodiments are described below. After reading this specification, skilled artisans will appreciate that those aspects and embodiments are only illustrative and do not limit the scope of the present invention.

In a first aspect, an electronic device can include a substrate including an underlying doped region and a semiconductor layer overlying the substrate, wherein the semiconductor layer has a primary surface opposite the underlying doped region, and a trench has sidewalls and extends at least partly through the semiconductor layer. The electronic device can further include a first conductive structure adjacent to the underlying doped region, an insulating layer within the trench, and a second conductive structure within the trench. The insulating layer can be disposed between the first and second conductive structures, and the first conductive structure can be disposed between the insulating layer and the underlying doped region.

In an embodiment of the first aspect, the first conductive structure includes a conductive fill material, and the first conductive structure is disposed within the trench. In a particular embodiment, the trench extends to the underlying doped region. In another embodiment, the first conductive structure includes a heavily doped portion of the semiconductor layer disposed below the trench, wherein the first conductive structure underlies and generally corresponds to the trench. In still another embodiment, the semiconductor layer includes a first semiconductor layer and a second semiconductor layer, wherein the first semiconductor layer is adjacent to the underlying doped region and has a first dopant concentration, and the second semiconductor layer is adjacent to the primary surface and is undoped or has a second dopant concentration less than the first dopant concentration. In a particular embodiment, each of the first and second semiconductor layers is at least approximately 1.1 microns thick. In another particular embodiment, the first semiconductor layer has a dopant concentration in a range of approximately $2 \times 10^{17}$ atoms/cm$^3$ to approximately $5 \times 10^{18}$ atoms/cm$^3$.

In a further embodiment, the electronic device further includes a vertically-oriented doped region adjacent to a sidewall of the trench, wherein the vertically-oriented doped region is electrically insulated from the second conductive structure. In a particular embodiment, the vertically-oriented doped region has a peak dopant concentration in a range of approximately $5 \times 10^{16}$ atoms/cm$^3$ to approximately $5 \times 10^{18}$ atoms/cm$^3$. In still a further embodiment, the electronic device further includes a gate electrode, wherein substantially all of the gate electrode overlies the primary surface.

In a second aspect, a process of forming an electronic device can include forming a semiconductor layer overlying a substrate, wherein the substrate includes an underlying doped region, and the semiconductor layer has a primary surface opposite the underlying doped region. The process can also include forming a trench extending at least partly through the semiconductor layer, wherein the trench has sidewalls, forming a first conductive layer that fills at least a bottom portion of the trench, and removing a portion of the first conductive layer to form a first conductive structure, wherein an uppermost part of the first conductive layer is disposed below the primary surface. The process can further include forming an insulating layer within the trench and after removing the portion of the first conductive layer, and forming a second conductive structure within the trench after forming the insulating layer, wherein the second conductive structure is electrically insulated from the first conductive structure.

In an embodiment of the second aspect, the process further includes etching the semiconductor layer to widen the trench after forming the first conductive layer, wherein the trench is wider after etching the semiconductor layer. In another embodiment, the process further includes forming a doped semiconductor layer within the trench after removing the portion of the first conductive layer and before forming the insulating layer. In a particular embodiment, the process further includes forming another semiconductor layer within the trench after forming the doped semiconductor layer and before forming the insulating layer, wherein the other semiconductor layer is undoped or has a lower dopant concentration as compared to the doped semiconductor layer. In another particular embodiment, the process further includes thermally growing an oxide layer to round a corner of the trench adjacent to the primary surface. In still another particular embodiment, the process further includes forming a gate electrode of a transistor structure over the primary surface of the semiconductor layer after forming the second conductive structure, and forming a source region of the transistor structure, wherein in a finished device, the source region and the second conductive structure are electrically connected to each other.

In a third aspect, a process of forming an electronic device can include forming a semiconductor layer overlying a substrate, wherein the substrate includes an underlying doped region, and the semiconductor layer has a primary surface opposite the underlying doped region. The process can further include forming a trench extending at least partly through the semiconductor layer, wherein the trench has sidewalls, and doping a first portion of the semiconductor layer underlying the trench to form a first conductive structure. The process can still further include forming an insulating layer within the trench and over the first conductive structure, and forming a second conductive structure within the trench, wherein the insulating layer is disposed between the second conductive structure and each of the first conductive structure and the semiconductor layer.

In an embodiment of the third aspect, forming the semiconductor layer includes forming a first semiconductor layer over the underlying doped region, wherein the first semiconductor layer has a first dopant concentration, and forming a second semiconductor layer over the first semiconductor layer, wherein the second semiconductor layer is undoped or has a second dopant concentration less than the first dopant concentration. In another embodiment, the process further includes doping a second portion of the semiconductor layer along the sidewalls of the semiconductor layer to form a vertically-oriented doped region, wherein doping the first portion of the semiconductor layer is performed by ion implantation at a first tilt angle, and doping the second portion of the semiconductor layer is performed by ion implantation at a second tilt angle that is greater than the first tilt angle. In a particular embodiment, the vertically-oriented doped region and the first conductive structure are parts of a drain region of a transistor structure.

Note that not all of the activities described above in the general description or the examples are required, that a portion of a specific activity may not be required, and that one or more further activities may be performed in addition to those described. Still further, the order in which activities are listed is not necessarily the order in which they are performed.

Certain features are, for clarity, described herein in the context of separate embodiments, may also be provided in combination in a single embodiment. Conversely, various features that are, for brevity, described in the context of a single embodiment, may also be provided separately or in any subcombination. Further, reference to values stated in ranges includes each and every value within that range.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. A process of forming an electronic device comprising:
    forming a semiconductor layer overlying a substrate, wherein:
        the substrate includes an underlying doped region; and
        the semiconductor layer has a primary surface opposite the underlying doped region;
    forming a trench extending at least partly through the semiconductor layer, wherein the trench has sidewalls;
    forming a first conductive layer that fills at least a bottom portion of the trench;
    removing a portion of the first conductive layer to form a first conductive structure,
        wherein an uppermost part of the first conductive layer is disposed below the primary surface;
    forming an insulating layer within the trench after removing the portion of the first conductive layer; and
    forming a second conductive structure within the trench after forming the insulating layer, wherein the second conductive structure is electrically insulated from the first conductive structure.

2. The process of claim 1, further comprising etching the semiconductor layer to widen the trench after forming the first conductive layer, wherein the trench is wider after etching the semiconductor layer.

3. The process of claim 1, further comprising forming a doped semiconductor layer within the trench after removing the portion of the first conductive layer and before forming the insulating layer.

4. The process of claim 3, further comprising forming another semiconductor layer within the trench after forming the doped semiconductor layer and before forming the insulating layer, wherein the other semiconductor layer is undoped or has a lower dopant concentration as compared to the doped semiconductor layer.

5. The process of claim 3, further comprising thermally growing an oxide layer to round a corner of the trench adjacent to the primary surface.

6. The process of claim 3, further comprising:
    forming a gate electrode of a transistor structure over the primary surface of the semiconductor layer after forming the second conductive structure; and
    forming a source region of the transistor structure,
        wherein in a finished device, the source region and the second conductive structure are electrically connected to each other.

7. A process of forming an electronic device comprising:
    forming a semiconductor layer overlying a substrate, wherein:
        the substrate includes an underlying doped region; and
        the semiconductor layer has a primary surface opposite the underlying doped region;
    forming a trench extending at least partly through the semiconductor layer, wherein the trench has sidewalls;
    doping a first portion of the semiconductor layer underlying the trench to form a first conductive structure;
    doping a second portion of the semiconductive layer along the sidewalls of the semiconductor layer to form a vertically-oriented doped region, wherein:
        doping the first portion of the semiconductor layer is performed by ion implantation at a first tilt angle; and
        doping the second portion of the semiconductor layer is performed by ion implantation at a second tilt angle that is greater than the first tilt angle;
    forming an insulating layer within the trench and over the first conductive structure; and
    forming a second conductive structure within the trench, wherein the insulating layer is disposed between the second conductive structure and each of the first conductive structure and the semiconductor layer.

8. The process of claim 7, wherein forming the semiconductor layer comprises:
    forming a first semiconductor layer over the underlying doped region, wherein the first semiconductor layer has a first dopant concentration; and
    forming a second semiconductor layer over the first semiconductor layer, wherein the second semiconductor layer is undoped or has a second dopant concentration less than the first dopant concentration.

9. The process of claim 7, wherein the vertically-oriented doped region and the first conductive structure are parts of a drain region of a transistor structure.

10. A process of forming an electronic device comprising:
    forming a semiconductor layer overlying a substrate, wherein:
        the substrate includes an underlying doped region; and
        the semiconductor layer has a primary surface opposite the underlying doped region;
    forming a trench extending at least partly through the semiconductor layer, wherein the trench has sidewalls;
    forming a first conductive structure disposed below the primary surface;
    forming an insulating layer within the trench after forming the first conductive structure;
    forming a second conductive structure within the trench after forming the insulating layer, wherein the second conductive structure is electrically insulated from the first conductive structure; and
    forming a drain region within the semiconductor layer and adjacent to the first conductive structure, wherein the first conductive structure is at least part of an electrical connection between the drain region and the underlying doped region,
    wherein the electronic device has a horizontally-oriented channel region.

11. The process of claim 10, further etching the semiconductor layer to widen the trench after forming the first conductive structure, wherein the trench is wider after etching the semiconductor layer.

12. The process of claim 10, further comprising forming a doped semiconductor layer within the trench after forming the first conductive structure and before forming the insulating region.

13. The process of claim 12, further comprising forming another semiconductor layer within the trench after forming the doped semiconductor layer and before forming the insulating layer, wherein the other semiconductor layer is undoped or has a lower dopant concentration as compared to the doped semiconductor layer.

14. The process of claim 12, further comprising thermally growing an oxide layer to round a corner of the trench adjacent to the primary surface.

15. The process of claim 12, further comprising:
   forming a gate electrode of a transistor structure over the primary surface of the semiconductor layer after forming the second conductive structure; and
   forming a source region of the transistor structure, wherein in a finished device, the source region and the second conductive structure are electrically connected to each other.

* * * * *